United States Patent
Pong et al.

(10) Patent No.: US 12,224,585 B2
(45) Date of Patent: Feb. 11, 2025

(54) ANOMALY DETECTION IN ENERGY SYSTEMS

(71) Applicant: The University of Hong Kong, Hong Kong (CN)

(72) Inventors: Wing Tat Pong, Hong Kong (CN); Ke Zhu, Hong Kong (CN); Qi Xu, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 413 days.

(21) Appl. No.: 17/753,766

(22) PCT Filed: Sep. 12, 2019

(86) PCT No.: PCT/IB2019/057684
§ 371 (c)(1),
(2) Date: Mar. 14, 2022

(87) PCT Pub. No.: WO2021/048596
PCT Pub. Date: Mar. 18, 2021

(65) Prior Publication Data
US 2022/0376501 A1  Nov. 24, 2022

(51) Int. Cl.
*G01R 13/00*  (2006.01)
*G01R 19/25*  (2006.01)
(Continued)

(52) U.S. Cl.
CPC ........ *H02J 3/0012* (2020.01); *G01R 19/2513* (2013.01); *H02J 13/00002* (2020.01)

(58) Field of Classification Search
CPC .. H02J 3/0012; H02J 13/00002; G01R 13/00; G01R 19/2513; G01R 21/00;
(Continued)

(56) References Cited

U.S. PATENT DOCUMENTS

| | | | | |
|---|---|---|---|---|
| 6,798,263 | B1 * | 9/2004 | Leon | H03K 3/356139 327/217 |
| 2009/0128119 | A1 * | 5/2009 | Morii | H04L 25/0276 323/353 |
| 2018/0070253 | A1 * | 3/2018 | Kleinbeck | H04B 17/309 |

FOREIGN PATENT DOCUMENTS

EP  2241898 A1 * 10/2010 ............. G01R 21/06

OTHER PUBLICATIONS

Quek, Y.T., et al., "A Low Cost Master and Slave Distributed Intelligent Meter for Non-Intrusive Load Classification and Anomaly Warning," IEEE Instrumentation and Measurement Society, 2018, pp. 1-6.
(Continued)

*Primary Examiner* — Jeffrey P Aiello
(74) *Attorney, Agent, or Firm* — Saliwanchik, Lloyd & Eisenschenk

(57) ABSTRACT

A method and system are provided for anomaly detection in energy systems. Non-contact sensing of an energy system based on electric and magnetic fields uses non-contact electric- and magnetic-field sensors to produce electric- and magnetic-field signals. The electric and magnetic field signals are filtered to remove noise. Features are extracted and normalized from the magnetic and electric field signals to characterize parameters of each signal. Density-based spatial clustering of extracted features is performed using a selected minimum number of points required to form a cluster and a parameter indicating the distance within which data are considered to fall within the cluster. An anomaly is determined from data point(s) that do not fall within the cluster formed by data points in normal operation. The density-based spatial clustering of extracted features may be performed using a Density-Based Spatial Clustering of Application with Noise (DBSCAN) algorithm. Features may be extracted using Fourier analysis.

18 Claims, 15 Drawing Sheets

(51) Int. Cl.
    *H02J 3/00*    (2006.01)
    *H02J 3/12*    (2006.01)
    *H02J 13/00*   (2006.01)

(58) Field of Classification Search
    CPC .. G01R 31/085; G01R 31/083; G01R 31/081;
        G01R 31/08; G01R 31/00; G01R 22/10;
        G01R 29/00; G01R 27/00; G01R 25/00;
        G01R 23/00; Y02P 80/10; G06F 17/18;
        G06F 18/21; Y04S 10/52; Y04S 10/12;
        Y04S 10/30
    USPC ............ 60/772; 73/600; 324/240, 536, 200,
        324/220; 340/561, 551; 361/42;
        700/109, 26, 21; 702/59, 188, 179, 182,
        702/189, 185, 183, 184, 61, 34, 57, 35,
        702/127; 714/37, 25, 11.147, 11.157, 26,
        714/799
    See application file for complete search history.

(56) References Cited

OTHER PUBLICATIONS

Zhang, X., et al., "A New Anomaly Detection Method Based On Hierarchical Hmm," IEEE, 2003, pp. 249-252.

Tse, W.L., et al., "A Novel Voltage Quality Monitoring System," IEEE International Conference on Electric Utility Deregulation, Restructuring and Power Technologies (DRPT2004), Apr. 2004, pp. 671-676.

Coutinho, M.P., et al., "Anomaly Detection in Power System Control Center Critical Infrastructures using Rough Classification Algorithm," IEEE International Conference on Digital Ecosystems and Technologies, 2009, pp. 733-738.

Wrinch, M., et al., "Anomaly Detection of Building Systems Using Energy Demand Frequency Domain Analysis," EEE Power & Energy Society General Meeting, Jul. 2012, pp. 1-7.

Martinelli, M., et al., "Electric Power System Anomaly Detection Using Neural Networks," 2004, pp. 1242-1248.

Shaw, S.R., et al., "Nonintrusive Load Monitoring and Diagnostics in Power Systems," IEEE Transactions on Instrumentation and Measurement, Jul. 2008, 57(7):1445-1454.

Catterson, V.M., "On-line Transformer Condition Monitoring through Diagnostics and Anomaly Detection," IEEE, 2009, pp. 1-6.

Chou, J.-S., et al., "Real-time detection of anomalous power consumption," Renewable and Sustainable Energy Reviews, 2014, 33:400-411, Elsevier Ltd.

Yin, P.Y., et al., "Remote Power Quality Monitoring and Analysis System Using LabVIEW Software," International Instrumentation and Measurement Technology Conference, May 2009, pp. 1-5.

International Search Report dated Jun. 11, 2020 in International Application No. PCT/IB2019/057684.

* cited by examiner

```
Algorithm: DBSCAN (DB, epsilon, MinPts)
{
    C = 0                                                    //Cluster counter
    FOR each extracted and normalized data point P in database DB
        IF P ≠ visited
            Neighbours = RegionQuery(P)                      //Find neighbours of P
            IF Neighbours < MinPts                           //Compare the number of points in Neighbours with MinPts
                Label(P) = noise                             //Label P as noise
            ELSE
                C = C + 1
                ExpandCluster(P, Neighbours, C)              //Expand cluster C
            END
        END
    END
}

FUNCTION RegionQuery(Q, DB)
{
    Neighbours = Null
    FOR each data point P in DB
        IF distance(P, Q) ≤ epsilon                          //Calculate the Euclidean distance and compare with epsilon
            Neighbours = Neighbours ∪ {P}
        END
    END
    Return Neighbours
}

FUNCTION ExpandCluster(P, Neighbours, C)
{
    Label(P) = C                                             // Label P as cluster C
    FOR each data point Q in Neighbours
        IF Q ≠ visited
            Neighbours_Q = RegionQuery(Q)
            IF Neighbours_Q ≥ MinPts
                Neighbours = Neighbours ∪ Neighbours_Q
            END
        END
        IF Q = noise
            Label(Q) = C                                     //Change noise to cluster C
        END
    END
}
```

FIG. 3(b)

ANOMALY DETECTION IN ENERGY SYSTEMS

CROSS-REFERENCE TO RELATED APPLICATION

This application is the U.S. national stage application of International Patent Application No. PCT/IB2019/057684, filed Sep. 12, 2019, the disclosure of which is incorporated herein by reference in its entirety.

FIELD OF THE INVENTION

The present invention relates to anomaly detection in energy systems and, more particularly, to anomaly detection using both electric- and magnetic field sensors with data analysis by density-based spatial clustering.

BACKGROUND

Due to the essential nature of electricity to power all aspects of work and home life, the quality of electrical power delivered to customers is gaining increased attention. Many electrical appliances such as computers, audio-visual devices, and mobile phones, are sensitive to the quality of power. There are several factors contributing to degraded power quality such as harmonic pollution which causes additional stress on the system, excessive reactive power which charges useless power to the system, and low-efficiency equipment in operation. Poor quality of power may damage electrical infrastructure; the explosion of transformers or breakdown of electrical insulators may both be caused by the poor quality of power in transmission lines. Consequently, it is important to detect electrical anomalies precisely and in a timely manner; through detection, corresponding corrective action may be promptly implemented in the energy system.

Devices currently available for anomaly detection in energy systems are not fully satisfactory because they may (i) be intrusive to energized conductors, (ii) be unreliable due to only relying on one measurement, and/or (iii) require pre-analysis of the network or use only pre-defined anomaly categories. WO 0048149 describes a modular power quality monitoring device adaptable to an electrical anomaly detection circuit. The device can detect electrical anomalies such as harmonic distortion, phase shifting, and voltage transients. However, it is invasive to the system under monitoring since the input signals are captured from potential and current transformers. Therefore, insulation and isolation measures are necessary, which significantly increases the installation difficulty and cost. Further, the advance definition of anomaly categories is required. Each module handles a corresponding category of anomaly. As a result, this device is unable to identify anomalies that lie outside the pre-defined categories.

Tse et al. (IEEE Int'l Conf. of Electric Utility Deregulation, 2004, p. 671) describe a voltage monitoring system using a compact microprocessor module. A potential transformer is installed to step down the voltages as signal input. However, the voltage monitoring system is only capable of detecting anomalies involving voltage without information regarding the signal of current flow. Moreover, a threshold needs to be set for recognizing an anomaly in power quality.

Shaw et al., (IEEE Transactions of Instrumentation and Measurement, Vol. 57, No. 7, p. 1445, 2008) describes a non-invasive load monitoring device for event classification. Magnetic fields are measured by Hall-effect sensors for reconstructing the current. It is only adaptable to a finite number of anomalies because the data are classified by comparison to a library of transient signatures. Also, because no voltage signals are measured, its detection capability is limited and it cannot capture a broad range of power anomalies.

Yin et al. (2009 IEEE Instrumentation and Measurement Tech. Conf. 2009, p. 279) describe a real-time monitoring and analysis system. Both voltage and current are measured in the system, which broadens the range of detectable power quality disturbances. However, all the analysis is based on disturbance events stored in log files. Due to the limited number of disturbance events which can be saved in log files, only certain power quality disturbances may be detected.

In short, there remains a need in the art for a non-invasive system that can analyze both voltage and current anomalies, and does not require pre-analysis of an electrical power network or pre-definition of anomaly categories.

BRIEF SUMMARY OF THE INVENTION

A novel system for anomaly detection in energy systems is described that overcomes the drawbacks of conventional detection systems. Since electric and magnetic fields are respectively correlated with the voltage and current of an energy system, non-invasive electromagnetic sensors are applied in the anomaly detection technique of the present invention. Time- and frequency-domain signals from the electromagnetic sensors are capable of characterizing the status of an energy system without setting any threshold or being limited by categories of anomalies. The present invention enables autonomous condition monitoring of critical components for the energy system and alerts to anomalous conditions such as power quality failures. The system offers unique advantages of non-invasive detection, low cost, easy installation, and robustness in harsh environments. The invention may be applied to energy systems for more stable and efficient power delivery in a smart grid.

In one aspect a method and system are provided for anomaly detection in energy systems. Non-contact sensing of an energy system based on magnetic field uses a non-contact magnetic field sensor to produce a magnetic field signal. Non-contact sensing of an energy system based on electric field uses a non-contact electric field sensor to produce an electric field signal. The magnetic field signal and the electric field signal are filtered to remove noise. Features are extracted from the magnetic field signals and the electric field signals to characterize parameters of each signal. Density-based spatial clustering of normalized extracted features is performed using a selected minimum number of points required to form a cluster and a parameter indicating the distance within which data are considered to fall within the cluster. Various anomalies are detected when data points do not fall within the cluster of features which are extracted from signals in normal operation. The density-based spatial clustering of extracted features is performed using a Density-Based Spatial Clustering of Applications with Noise (DBSCAN) algorithm. Features may be extracted using Fourier analysis.

BRIEF DESCRIPTION OF THE DRAWINGS:

FIG. 3(a) depicts clusters and outliers for DBSCAN and FIG. 3(b) is the pseudo-code for implementing DBSCAN in this invention;

DETAILED DESCRIPTION

Figure 1A:
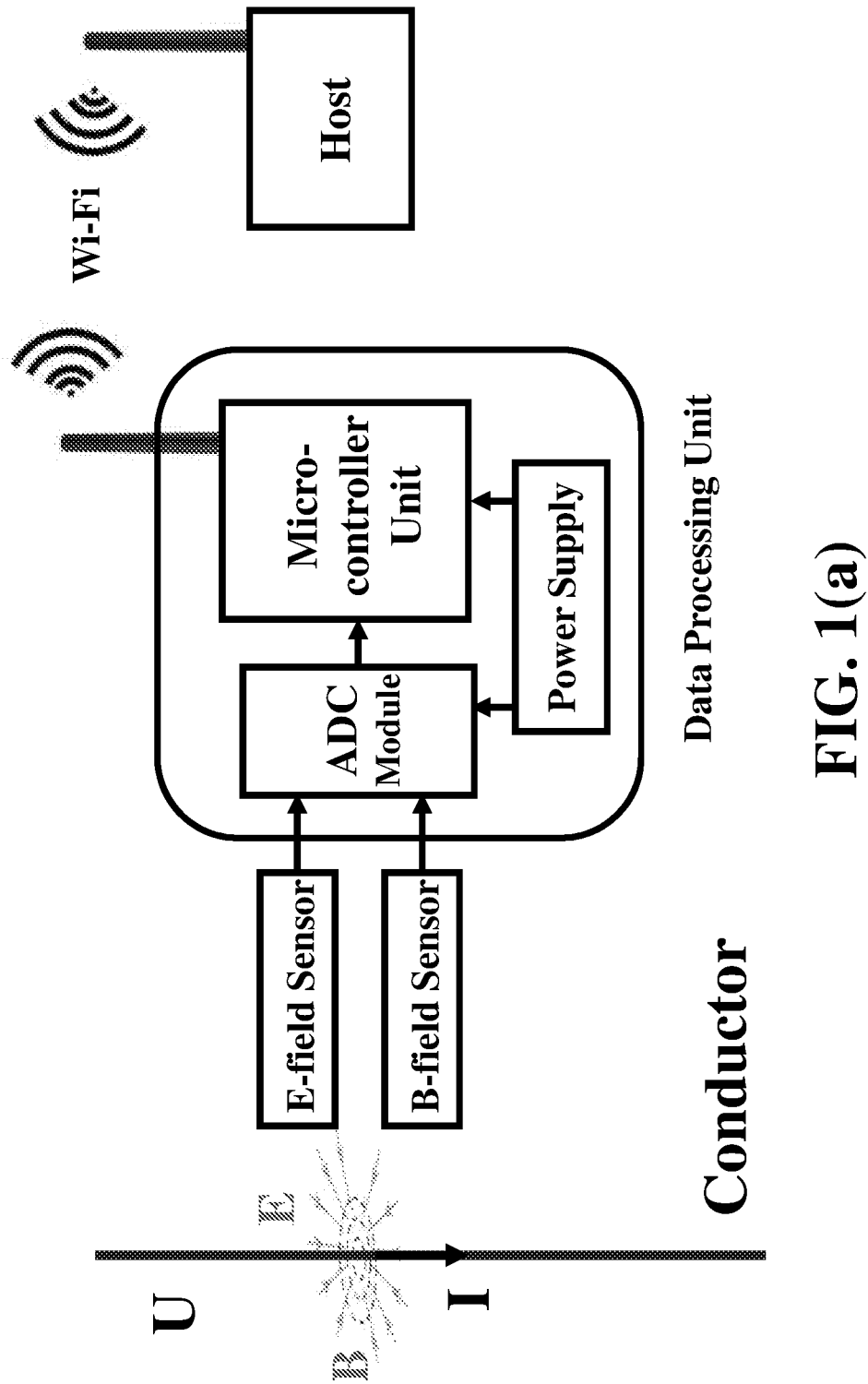
FIGS. 1(a) and 1(b) schematically depict an anomaly detection system according to an embodiment.
Figure 1B:
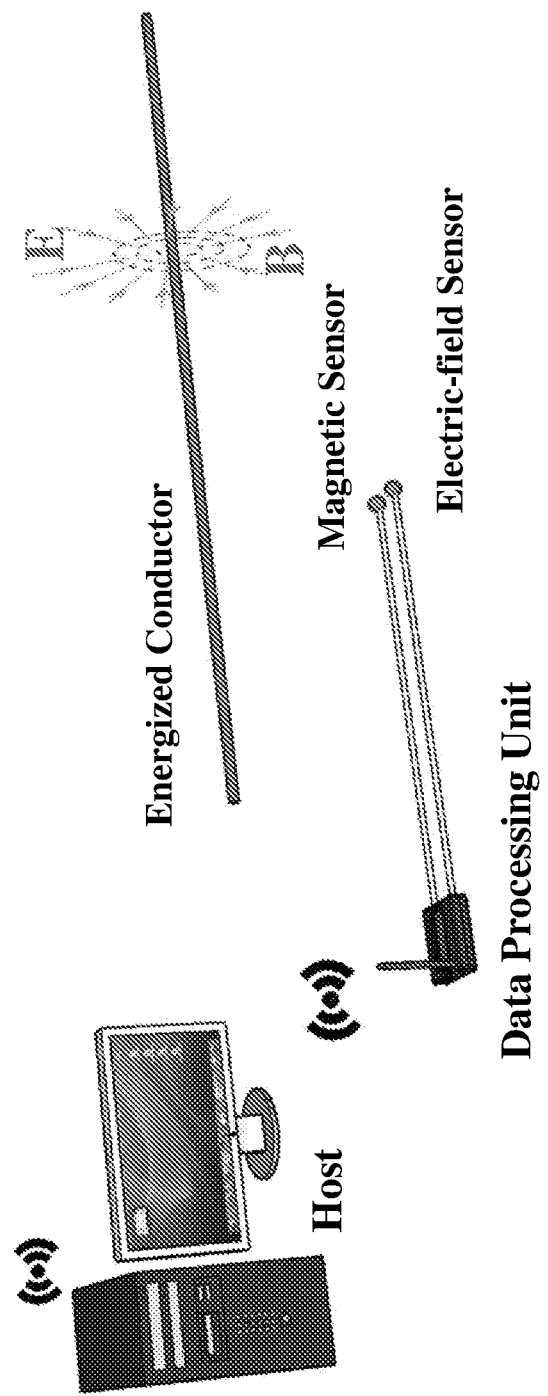

Turning to the drawings in detail, FIGS. 1(a) and 1(b) schematically depict a system for anomaly detection according to an embodiment. Anomaly detection system 15 includes an electric-field sensor 20 and a magnetic-field sensor 30. The electric-field sensor may be selected from electric field meters, microelectromechanical sensors that measure the electric field strength in a free field, or fiber-optic electric-field sensor. An example of a suitable commercially-available device is ETS-Lindgren's Model HI-3638 VLF/ELF Electric Field Meter. The electric-field sensor/meter may be used to provide voltage information about a power system such as conductor 10 in FIG. 1(a). The magnetic-field sensor may be selected from magnetic sensors including anisotropic magnetoresistive sensors, tunneling magnetoresistive sensors, giant magnetoresistive sensors, Hall-effect sensors etc. An example of a suitable, commercially-available sensor, is TMR2307 from Multi-Dimension Technology Co. Ltd. This sensor uses three push-pull Wheatstone bridges and can measure weak magnetic fields and electric currents. The magnetic-field sensor may be used to provide current data about a power system. Both the electric-field sensor 20 and the magnetic-field sensor 30 are non-contact sensors and do not require any diversion of power from the conductor 10 in order to make their measurements.

A data processing unit 35 communicates with the electric-field sensor 20 and the magnetic-field sensor 30. The data processing unit 35 comprises an analog-to-digital converter (ADC) module 40, a power supply 50, and a micro-controller 45 with optional wireless transmission capabilities for communication with a host processor 60. The electric- and magnetic-field sensors are positioned adjacent any kind of power system (e.g., overhead transmission lines, power distribution cables, and wiring systems in office and residential buildings) to measure electromagnetic fields emanating from the system to be monitored. The analog signals from sensors 20 and 30 are converted to digital signals in the ADC module 40. Analysis may be performed in the microcontroller unit 45; alternatively, analysis may be performed in a host system 60. For centralized data management, the stored data in the data processing unit will be sent to an optional host 60 through an optional wireless connection.

Figure 2:
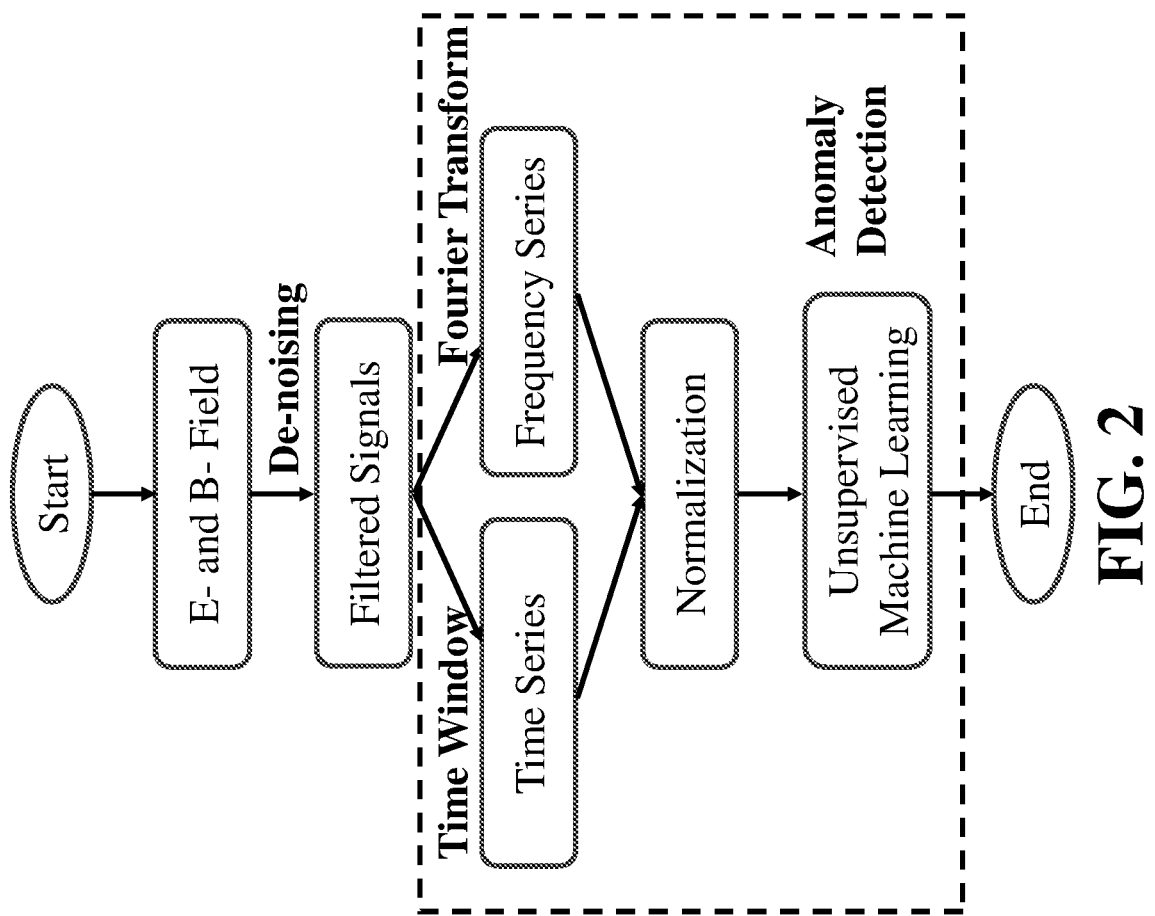
FIG. 2 is a flow chart of a method for anomaly detection according to an embodiment.

Turning to FIG. 2, the signal processing that occurs with the measured signals from sensors 20 and 30 is described. The signals are measured at step 100. It is recommended to locate the electric- and magnetic-field sensors as close to the system to be monitored as possible in order to achieve the most accurate signal measurements. However, this proximity may also capture electromagnetic noise emanating from a variety of power devices nearby, which can interfere with the signal from the target being measured. Therefore, the measured signals are subject to de-noising, leading to filtered signals at position 110 in FIG. 2.

Feature extraction occurs at positions 120 and 130. A series of parameters are extracted to characterize the measured and filtered signals. For example, the maximum, minimum, and root mean square values of electric- and magnetic-field waveforms in a time cycle may be determined. Fourier analysis may also be performed. Regarding the measurement in power systems, a Fourier frequency spectrum is a good reference for identifying the signatures of signal patterns such as the magnitude of the frequency spectrum at DC, 50 Hz, 150 Hz, and so on. Then these data are constructed in an array to describe the signal measurement.

Normalization 140: The normalization of the analyzed datasets is performed since the measured data are in different units (e.g., Tesla for magnetic fields, and V/m for electric fields) and sizes (e.g., the magnetic fields are in mini-Tesla, but the electric fields are in thousands V/m around for a 220 V conductor). Because anomaly detection involves analysis of Euclidian distances for different sets of data, normalization prepares the data for this analysis.

Figure 3A:
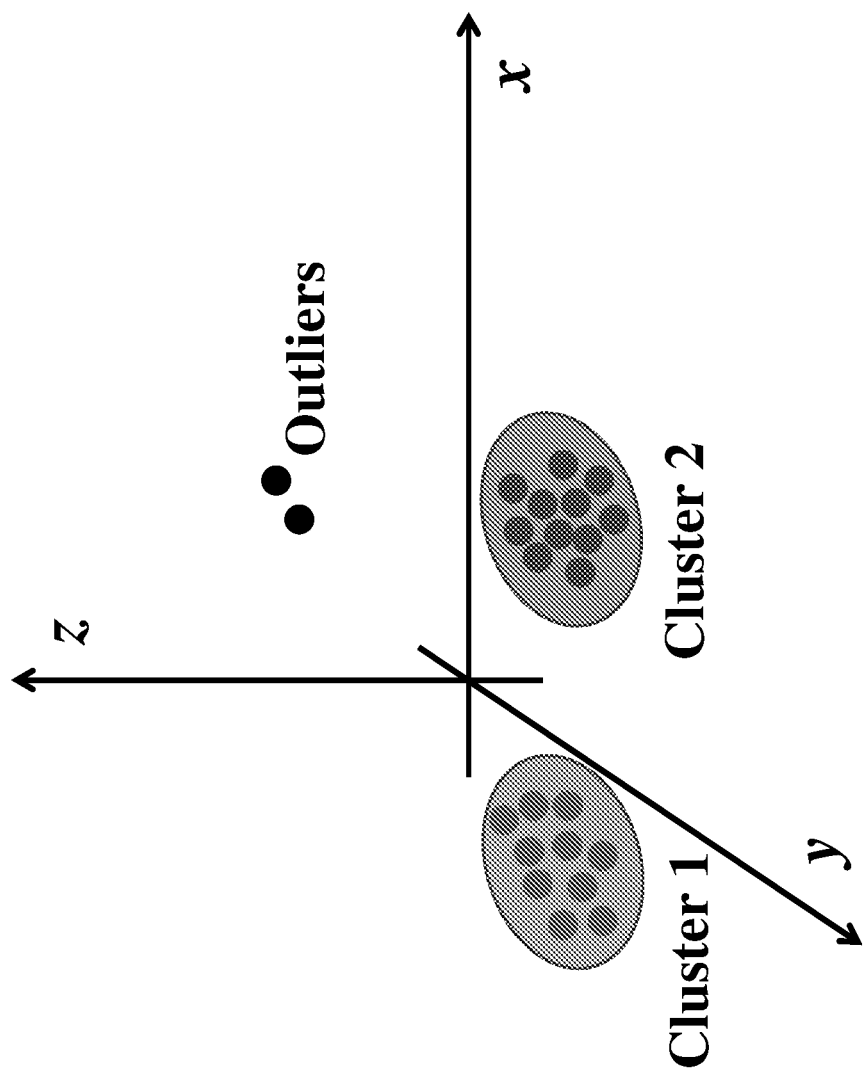

Anomaly identification 150: Computational intelligence is applied to the data resulting from the processes set forth above. In one embodiment, density-based spatial clustering (DBSCAN) of applications with noise is performed. DBSCAN analysis does not require the user to specify the number of clusters in the data in advance. DBSCAN clustering is robust to outliers due to its processing with noise. These two features make DBSCAN clustering suitable for processing the data from electromagnetic sensors and classifying the data for anomaly identification in a changing environment. In DBSCAN analysis, data points which are close enough to one another are grouped into one cluster while points in the low-density region are categorized as outliers as shown in FIG. 3(a).

DBSCAN (Density-Based Spatial Clustering of Applications with Noise) is an unsupervised machine learning method. Because it is unsupervised, there is no need to specify a particular outcome, for example, there is no need to specify the anomaly to be determined. DBSCAN involves creating n-dimensional shapes around a particular data point and determining how many data points fall within that shape. A sufficient number of data points means that the shape is a cluster. Clusters of high density (many data points) are distinguished from clusters of low density (fewer data points). By plotting the various data points and clustering the results based on the similarity of observation, points that are clearly outlying may be identified and investigated as outliers. For example, in FIG. 3(a), if cluster 1 is formed by data points collected in normal operation, then any data points which do not fall within cluster 1 are determined to be anomalies, such as data points in cluster 2. In other words, cluster 1 represents normal operation while cluster 2 represents one kind of anomaly which may be interruption. Meanwhile, there is a chance that some measurements are outliers due to measurement error, and hence corresponding data points are ignored and labeled as "outliers". The pseudo-code for implementing DBSCAN in this invention is shown in FIG. 3(b).

Two important parameters may be specified by the user to perform a DBSCAN analysis. A user may specify the minimum number of points that are required to form a cluster (MinPts). The user may also specify the distance $\varepsilon$ that a neighborhood can be connected to the cluster. By setting this parameter, the user can define the severity of the power system condition to be recognized as an anomaly. The larger the selected ε term, the less likely the condition is to be classified as an anomaly.

Simulations

To verify the effectiveness of the proposed anomaly detection in energy systems, simulations for two cases are performed, which are overhead transmission lines and the energy system in a multifamily residential building.

a. Overhead Transmission Lines

Figure 4:
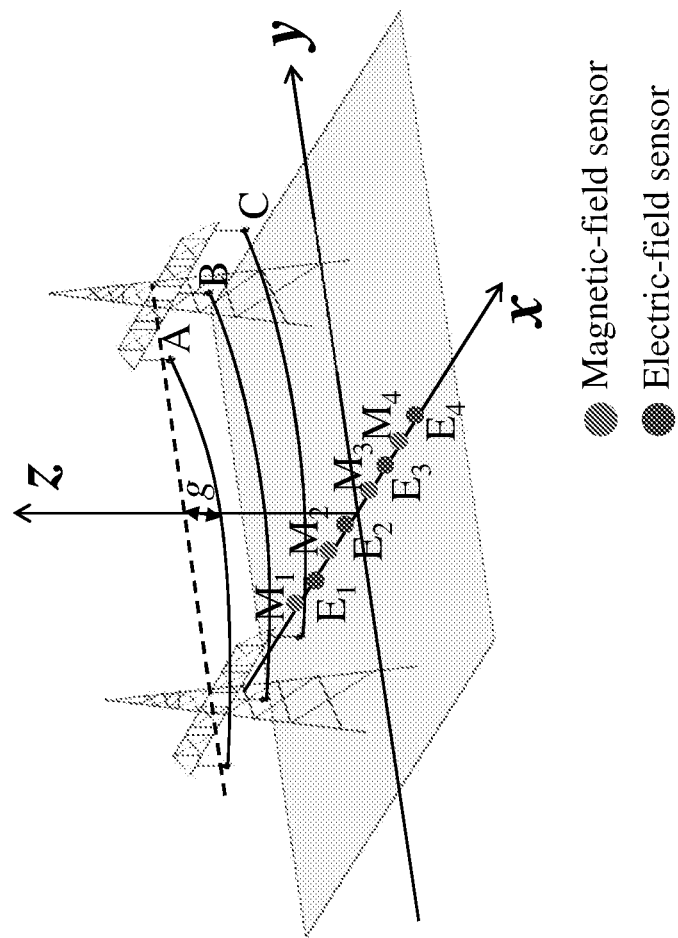
FIG. 4 depicts a layout for sensors in an overhead transmission line for a simulation of the present invention.

A three-phase overhead transmission system for delivering power is depicted in FIG. 4. The span of transmission lines is 400 m, the altitude of conductors at both ends is 30 m, the spacing distance between phase conductors is 10 m, and the sagging distance of transmission lines (g in FIG. 4) is 5 m. There are several electric- and magnetic-field sensors installed across the transmission lines on the ground, whose spatial positions are shown in Table I. They measure the electromagnetic fields in three-dimensions.

TABLE I

SPATIAL POSITIONS OF ELECTRIC- AND MAGNETIC-FIELD SENSORS

| Sensor | X (m) | Y (m) | Z (m) |
|---|---|---|---|
| $M_1$ | −0.7 | 0 | 0.01 |
| $E_1$ | −0.5 | 0 | 0.01 |
| $M_2$ | −0.3 | 0 | 0.01 |
| $E_2$ | −0.1 | 0 | 0.01 |
| $M_3$ | 0.1 | 0 | 0.01 |
| $E_3$ | 0.3 | 0 | 0.01 |
| $M_4$ | 0.5 | 0 | 0.01 |
| $E_4$ | 0.7 | 0 | 0.01 |

A series of conditions are simulated for the power delivered through the overhead transmission lines (Table II). They are: condition #0, the voltage and current are in rated values; condition #1, there is a slight voltage drop (−5%); condition #2, there is a slight voltage increase (+5%); condition #3, there is a slight current drop (−5%) by power changes at loading; condition #4, there is a slight current rise (+5%) by the power changes at loading; and condition #5, there are large voltage and current variations due to the single phase-to-ground fault occurred.

TABLE II

DIFFERENT CONDITIONS FOR VOLTAGE AND CURRENT AND CLUSTERING RESULTS OF OVERHEAD TRANSMISSION LINES

| Condition | Line voltage | Line current | Cluster | Remark |
|---|---|---|---|---|
| #0 | 13.8 kV | 1 kA | 1 | Normal |
| #1 | 13.11 kV (−5%) | 0.95 kA | 1 | Normal |
| #2 | 14.49 kV (+5%) | 1.05 kA | 1 | Normal |
| #3 | 13.8 kV | 0.95 kA (−5%) | 1 | Normal |
| #4 | 13.8 kV | 1.05 kA (+5%) | 1 | Normal |
| #5 | Single phase-to-ground fault | | 2 | Anomaly |

The electric- and magnetic-field strengths of each sensor were recorded in 3 axes, and their maximum and minimum values in a cycle were recorded and normalized as extracted features. The DBSCAN is deployed to cluster the cases (Minpts=2, and ε=0.1). The results in Table II indicate that Condition #0-4 belong to the same cluster, namely, a normal operating status of the power system. This is reasonable because a ±5% voltage or current variation is common in power system. However, Condition #5 does not belong to the previous cluster, and this is an anomaly (i.e., a short-circuit fault). The simulation results validate the effectiveness of the technique.

b. Multi Family Residential Building

Figure 5:
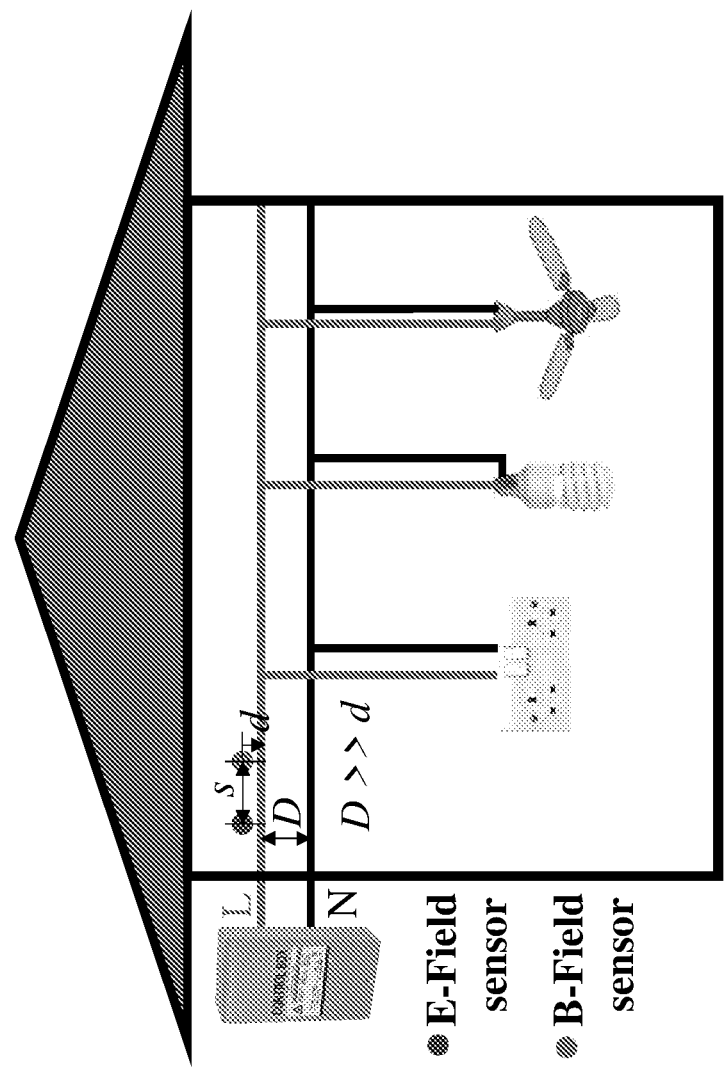
FIG. 5 depicts sensor placement near an energized cable in a residential building.
Figure 6A:
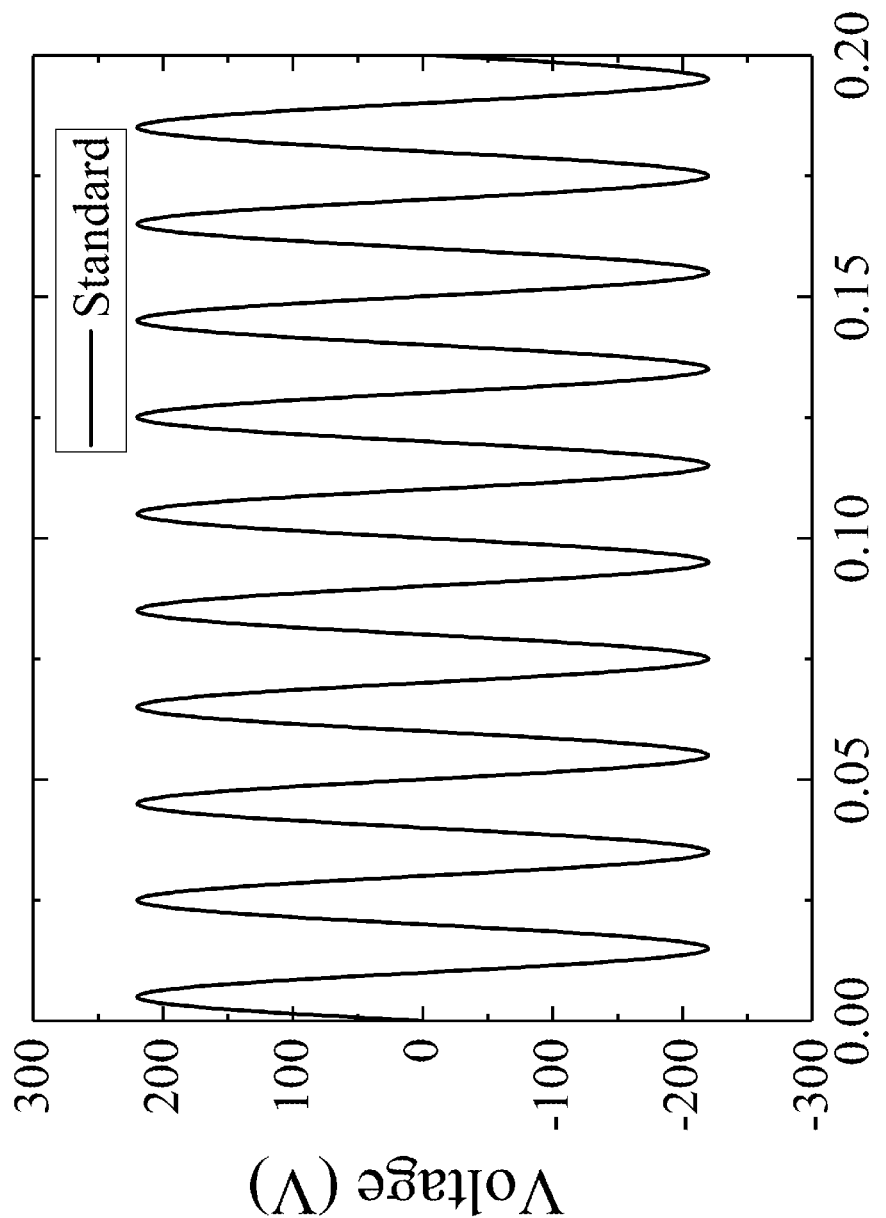
FIG. 6(a), FIG. 6(b), FIG. 6(c), FIG. 6(d), FIG. 6(e), FIG. 6(f), FIG. 6(g), and FIG. 6(h) depict different power-quality situations including standard, sag, swell, interruption, harmonic, transient, sag+harmonic, and swell+harmonic, respectively.
Figure 6B:
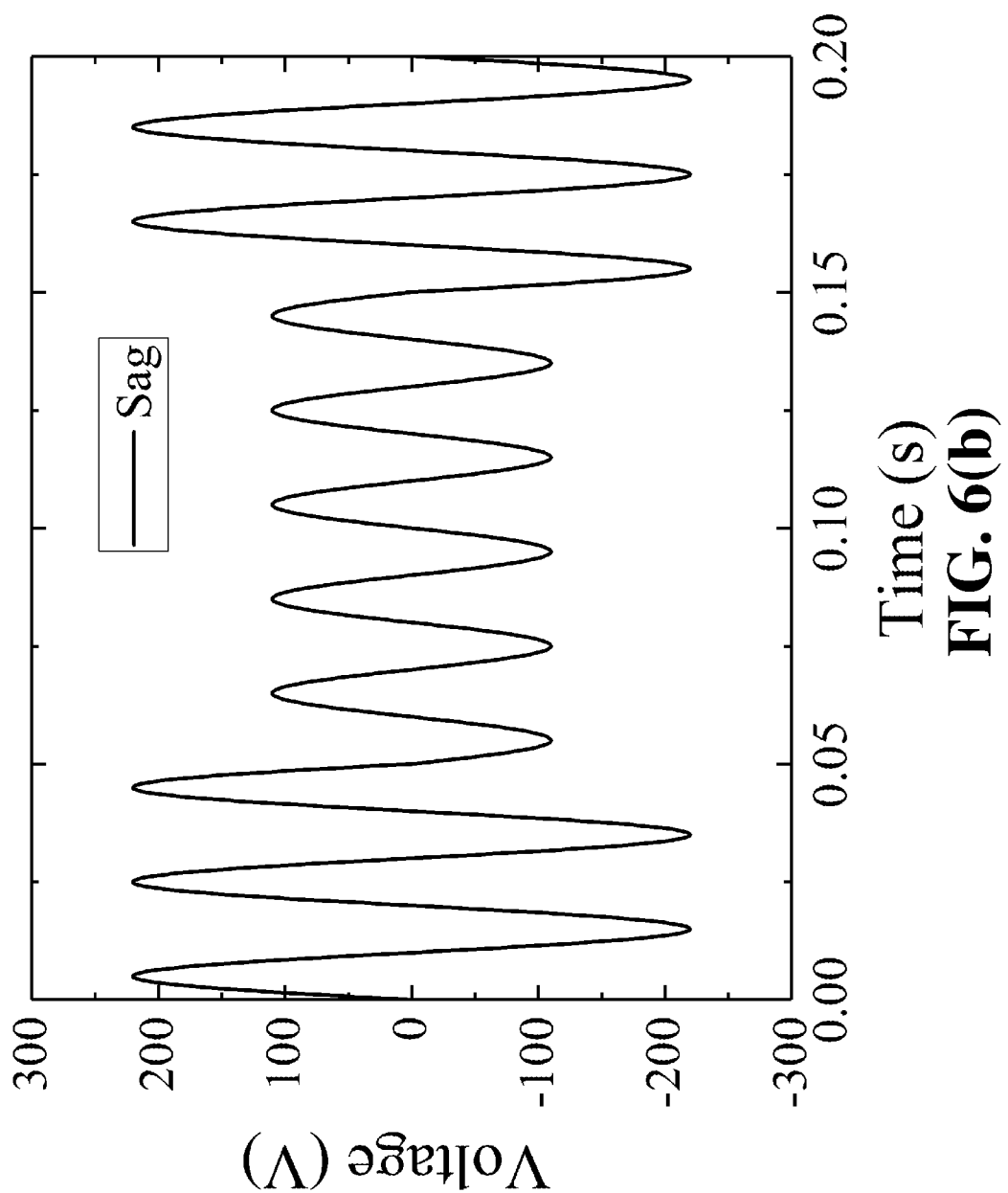
Figure 6C:
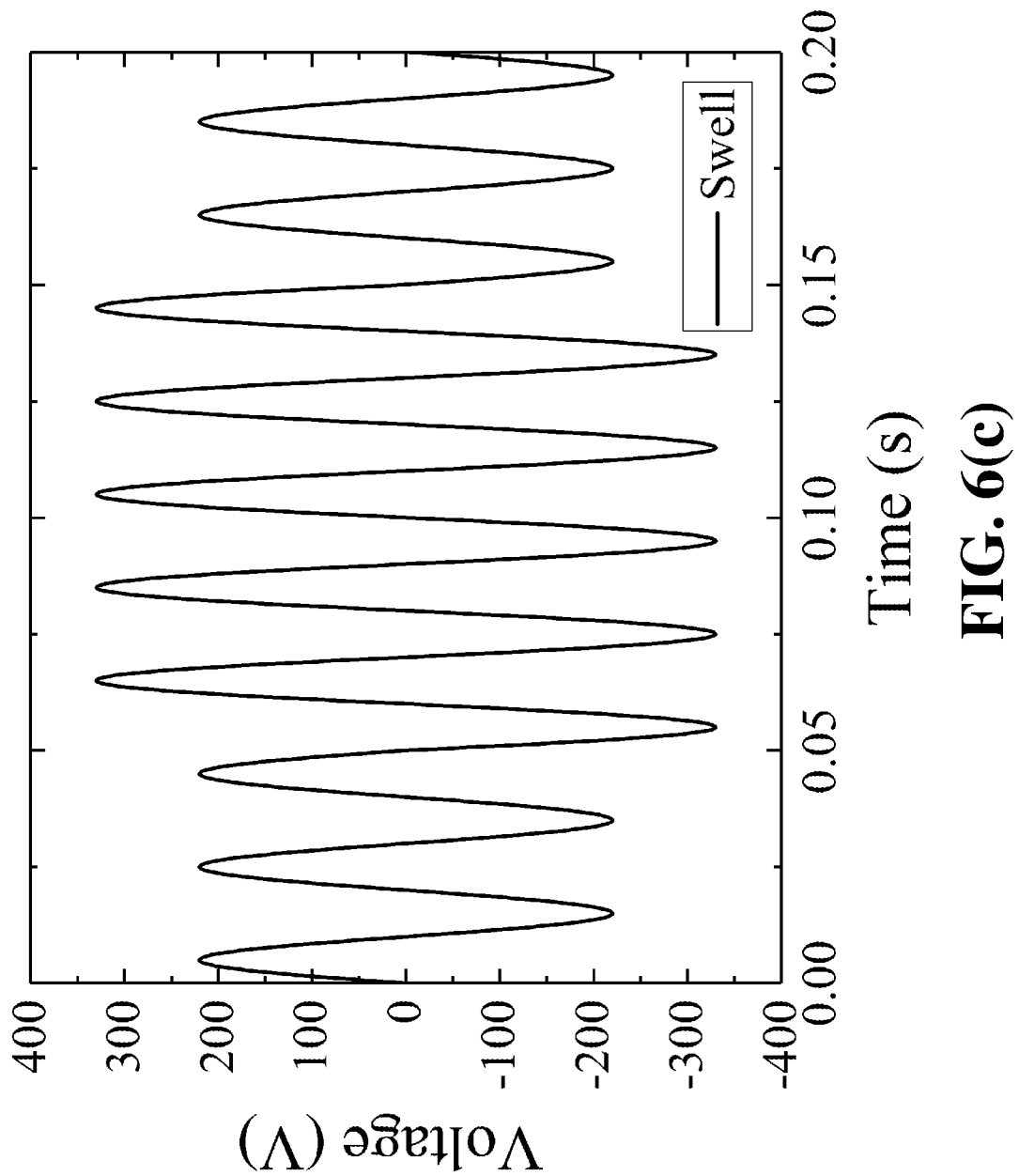
Figure 6D:
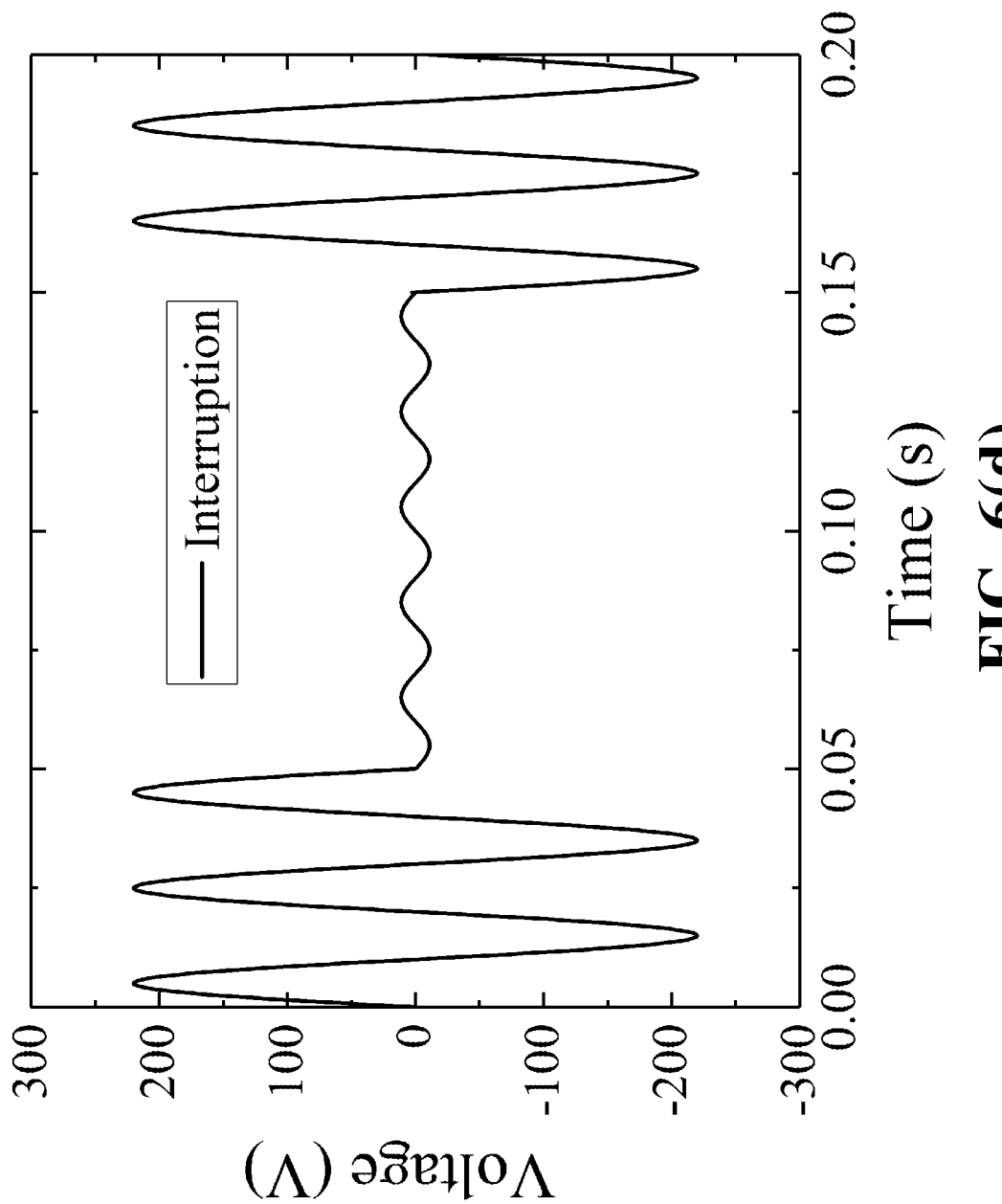
Figure 6E:
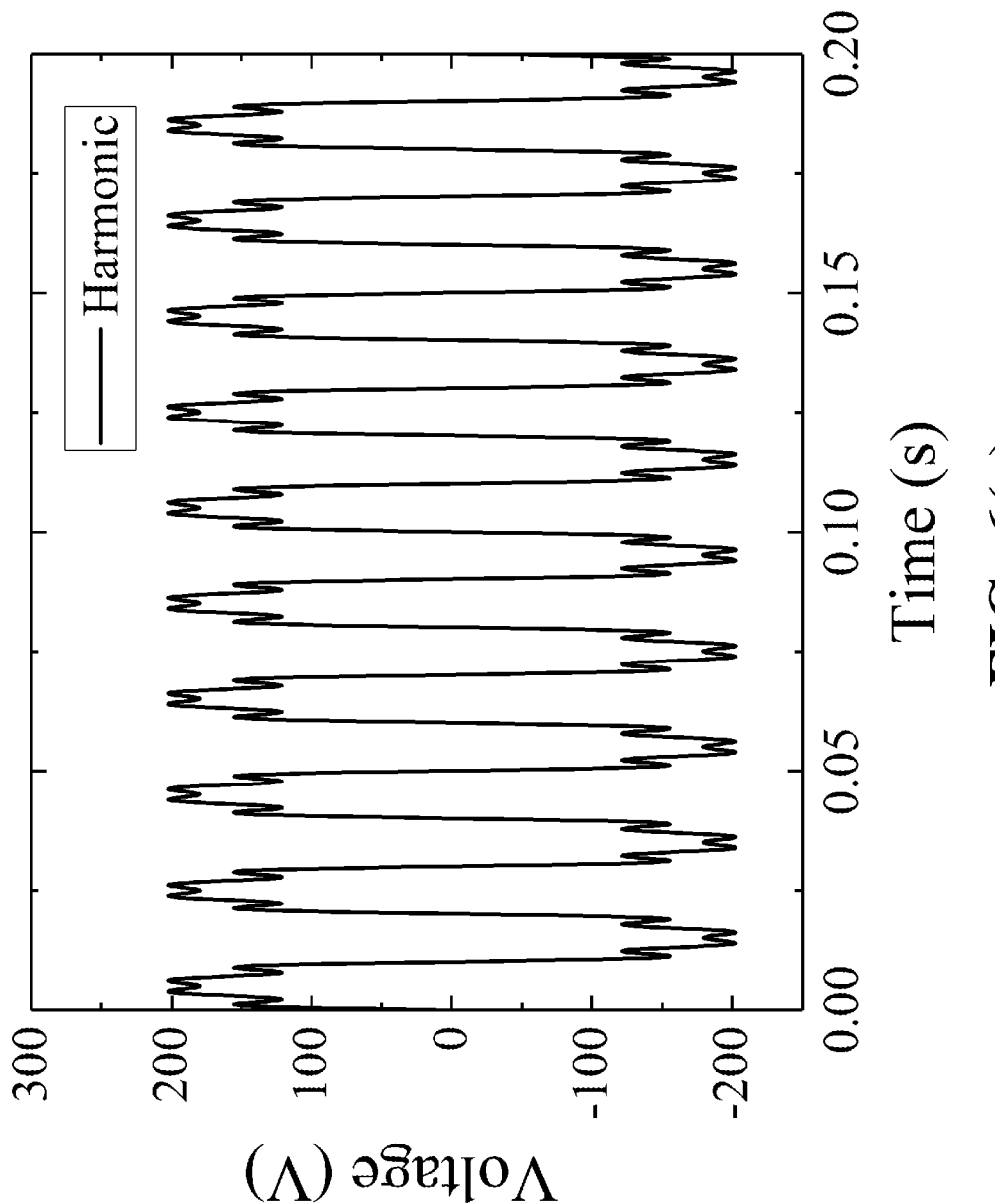
Figure 6F:
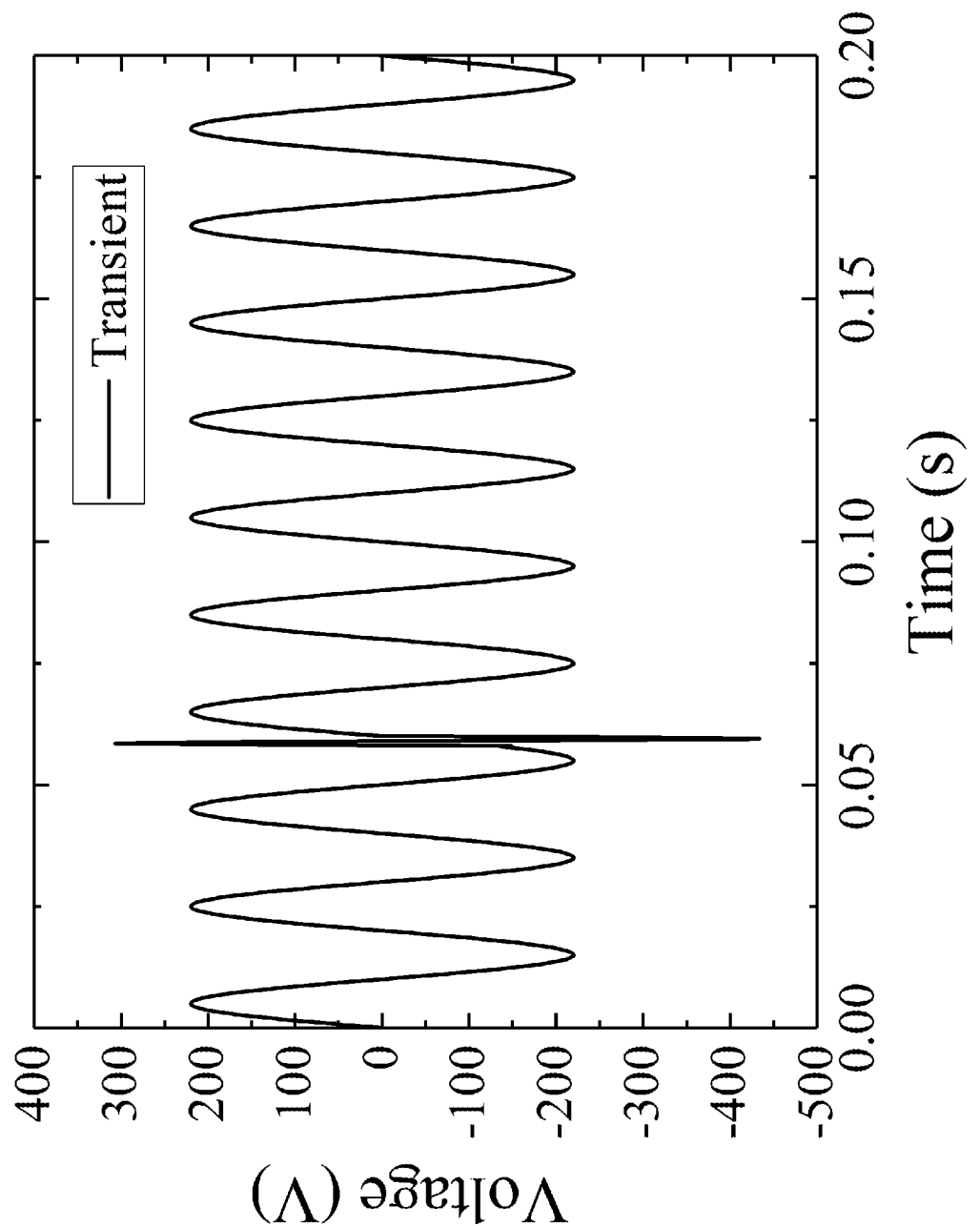
Figure 6G:
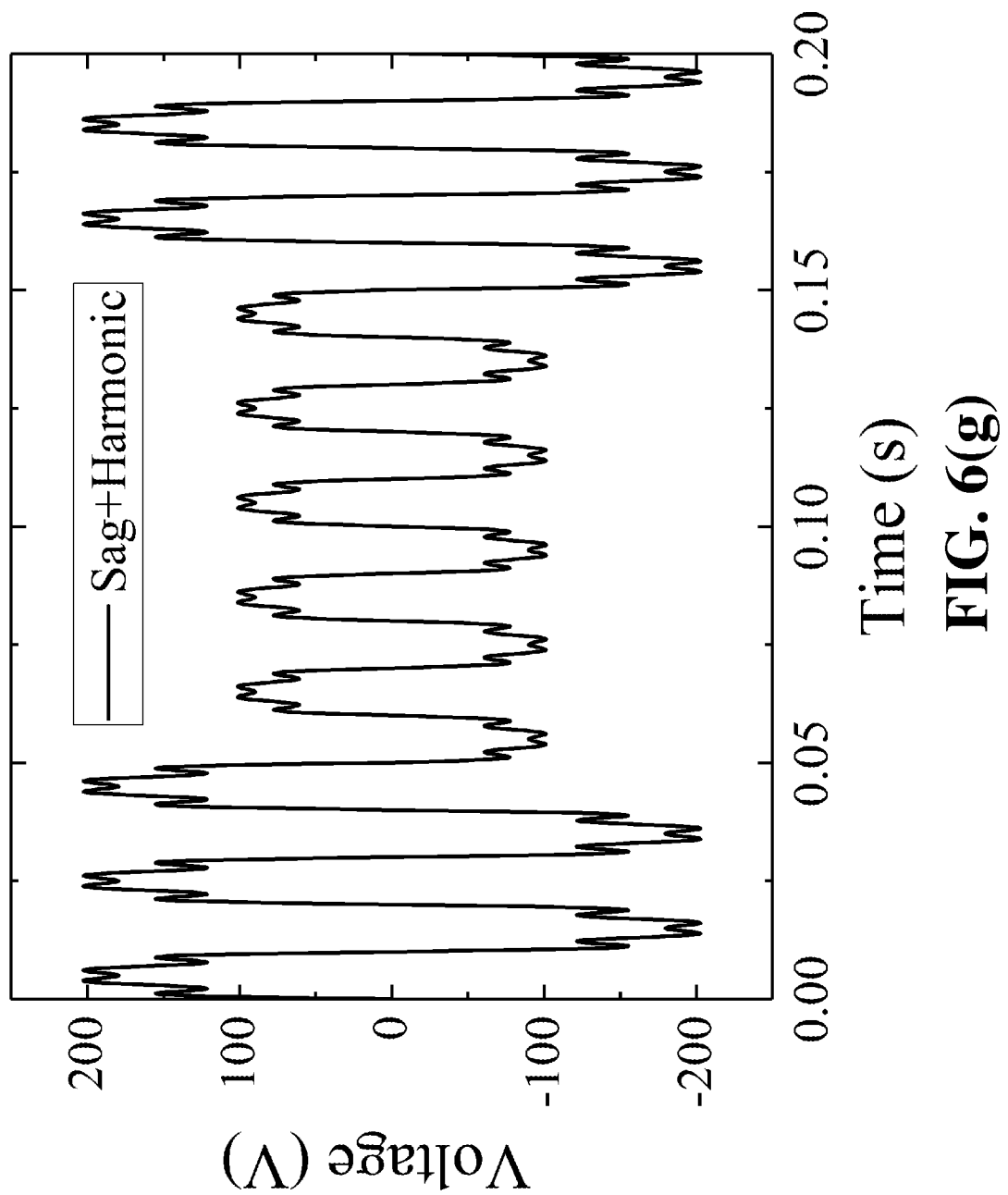
Figure 6H:
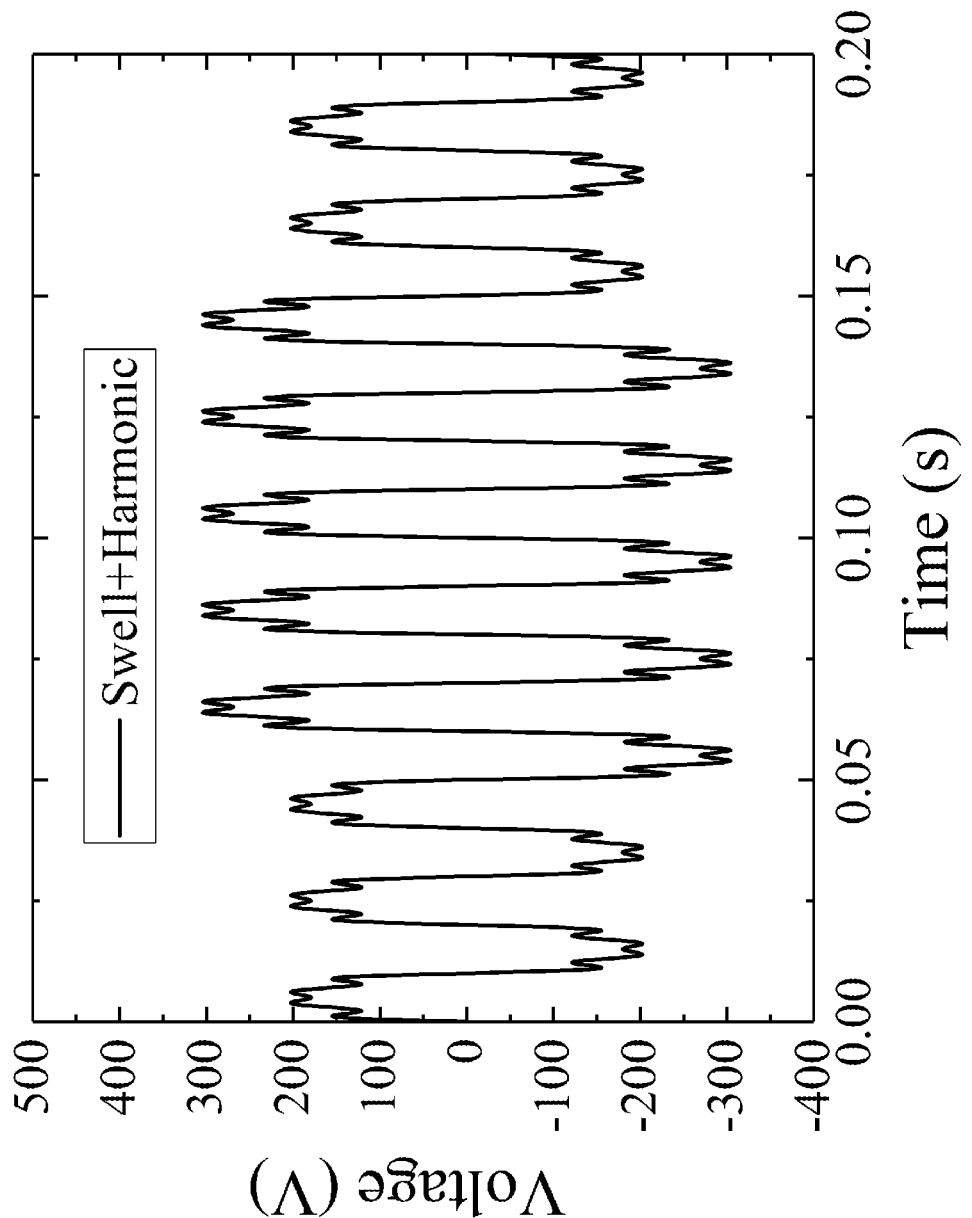

Single-phase wiring system is commonly used for delivering electricity to customers for most household appliances (e.g., lighting, fans) in residential buildings. In this case, electric- and magnetic-field sensors are located around one energized conductor in the residential building as depicted in FIG. 5. The setting of the sensors related to the conductor is that the distance between the live wire and the sensors (d) is 1 cm, the distance between adjacent sensors (s) is 10 cm, and the distance between a live and a neutral wire is 10 cm (D>>d). A series of different power qualities is simulated on the live wire starting from 0.05 s in FIGS. 6(a)-(h), including FIG. 6(a) standard, FIG. 6(b) sag, FIG. 6(c) swell, FIG. 6(d) interruption, FIG. 6(e) harmonic, FIG. 6(f) transient, FIG. 6(g) sag+harmonic, and FIG. 6(h) swell+harmonic. Also, two more conditions are given for voltage variations at ±5%. The loading is resistive, and thus the current changes in the same way as voltage. Totally, there are ten conditions in this case.

The measurements from the electric- and magnetic-field sensors in the simulation are recorded in a time cycle from 0.05 to 0.07 s, and their Fourier frequency spectrum is analyzed. The maximum and minimum values, and the amplitudes of the frequency spectrum at 50, 150 and 250 Hz after being normalized are chosen to represent the dataset. Then the DBSCAN is deployed to cluster all the ten conditions (Minpts=1, and ε=0.4). The results in Table III show that the conditions under a standard voltage waveform including its variation of ±5% are clustered into the same group, indicating they are the normal operating status of the energy system. Conditions other than the standard condition are classified into different groups. This means that the anomalies are identified for other conditions based on the group number shown in Table III (for conditions which do not belong to cluster #1). The simulation results validate that the technique successfully identifies anomaly conditions of the energy system in a residential building even with little variation in the measured voltages.

TABLE III

CLUSTERING RESULTS FOR TEN CONDITIONS OF ENERGY SYSTEM IN BUILDINGS

| Condition | Cluster | Remark |
|---|---|---|
| Standard | 1 | Normal |
| Standard (+5%) | 1 | Normal |
| Standard (−5%) | 1 | Normal |
| Sag | 2 | Anomaly |
| Swell | 3 | Anomaly |
| Interruption | 4 | Anomaly |
| Harmonic | 5 | Anomaly |
| Transient | 6 | Anomaly |
| Sag + Harmonic | 7 | Anomaly |
| Swell + Harmonic | 8 | Anomaly |

Advantageously, the electromagnetic-sensing-based technique using computational intelligence for anomaly detection in energy systems can monitor the electrical states of energy systems, including voltages and currents, and identify the anomaly conditions even with no prior knowledge of the number of anomaly categories. The technique is non-intrusive to energy systems due to its contactless electromagnetic sensing, which makes installation work of the invention from this technique easy and safe. Simulations of various power quality disturbances successfully verify the proposed technique. Moreover, the combinations of multi-power quality disturbances are also studied, and the proposed technique is still capable of detecting the anomalies without mixing with other anomalies This method needs a relatively small number of preset values. Only MinPts and ε are set in advance and can be selected to provide a threshold level to a detected anomaly. The system of the present invention can work powerfully with the aid of big data technology/large-scale machine learning to improve the overall power quality of energy systems. The proposed techniques are even able to categorize different kinds of anomaly conditions with the special patterns of anomalies recorded from big data technology. Therefore, the proposed technique is promising due to its easy installation, large detection capability, and robustness.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated.

The invention claimed is:

1. An anomaly detector for energy systems, the anomaly detector comprising:
    an array of non-contact magnetic field sensors configured to sense a magnetic field from an energy system to which it is disposed adjacent and to produce magnetic field signals indicating operating currents in the energy system;
    an array of non-contact electric field sensors configured to sense an electric field from the energy system to which it is disposed adjacent and to produce electric field signals indicating operating voltages in the energy system;
    an analog-to-digital converter in operable communication with the array of non-contact magnetic field sensors and the array of non-contact electric field sensors, the analog-to-digital converter being configured to convert the magnetic field signals and the electric field signals into digital signals;
    a filter to remove noise from the magnetic field signals and the electric field signals;
    a feature extractor to extract features from the current and voltage signals to characterize measurement parameters of each signal;
    a data processor configured to perform data clustering of extracted features; and
    an anomaly indicator identifying an anomaly from one or more data points that do not fall within a cluster.

2. The anomaly detector for energy systems according to claim 1, wherein each magnetic field sensor is an anisotropic magnetoresistive sensor, a tunneling magnetoresistive sensor, a giant magnetoresistive sensor, or a Hall-effect sensor.

3. The anomaly detector for energy systems according to claim 1, wherein each electric field sensor is a microelectromechanical sensor, a fiber-optic electric field sensor, or an electric field meter.

4. The anomaly detector for energy systems according to claim 1, wherein the data clustering is performed using Density-Based Spatial Clustering of Applications with Noise (DBSCAN) using a selected minimum number of points to form a cluster and a parameter indicating the distance between different clusters based on a dataset feature from magnetic and electric-field measurements.

5. The anomaly detector for energy systems according to claim 1, further comprising a wireless transmitter to connect to a host device.

6. The anomaly detector for energy systems according to claim 1, wherein the anomaly indicator provides the identified anomaly to a user of the anomaly detector to enable the user to take corrective action in the energy system based on the identified anomaly.

7. A method for anomaly detection in energy systems, the method comprising:
    disposing a non-contact magnetic field sensor and a non-contact electric field sensor adjacent to an energy system;
    performing non-contact sensing of a magnetic field of the energy system using the non-contact magnetic field sensor to produce a magnetic field signal indicating the operating current in the energy system;
    performing non-contact sensing of an electric field of the energy system using the non-contact electric field sensor to produce an electric field signal indicating the operating voltage in the energy system;
    filtering the magnetic field signal and the electric field signal to remove electromagnetic fields in the background that are not generated from the energy system;
    extracting features from the magnetic field signal and the electric field signal to characterize parameters of each signal;
    performing data clustering of extracted features; and
    identifying an anomaly from one or more data points that do not fall within a cluster indicating normal conditions.

8. The method for anomaly detection in energy systems according to claim 7, wherein the data clustering of extracted features is performed using a Density-Based Spatial Clustering of Applications with Noise (DBSCAN) algorithm that uses a selected minimum number of points to form a cluster and a parameter indicating a distance between different clusters based on a dataset feature.

9. The method for anomaly detection in energy systems according to claim 7, wherein the energy system is a transmission system or a residential electrical cable.

10. The method for anomaly detection in energy systems according to claim 7, wherein the magnetic field sensor is an anisotropic magnetoresistive sensor, a tunneling magnetoresistive sensor, a giant magnetoresistive sensor, or a Hall-effect sensor.

11. The method for anomaly detection in energy systems according to claim 7, wherein the electric field sensor is a microelectromechanical sensor, a fiber-optic electric field sensor, or an electric field meter.

12. The method for anomaly detection in energy systems according to claim 7, wherein the feature extraction includes analysis of a Fourier frequency spectrum of the electric field signal and/or the magnetic field signal.

13. The method for anomaly detection in energy systems according to claim 7, wherein the feature extraction includes analyzing a maximum, minimum, and root-mean-square value of electric-and magnetic-field measurement of electromagnetic sensors in a time cycle, and a frequency spectrum in fundamental and harmonic frequency.

14. The method for anomaly detection in energy systems according to claim 7, wherein the non-contact sensing of the magnetic field of the energy system employs an array of non-contact magnetic field sensors.

15. The method for anomaly detection in energy systems according to claim 7, wherein the non-contact sensing of the electric field of the energy system employs an array of non-contact electric field sensors.

16. The method for anomaly detection in energy systems according to claim 7, further comprising:
   taking corrective action in the energy system based on the identified anomaly.

17. The method for anomaly detection in energy systems according to claim 16, wherein the magnetic field sensor is an anisotropic magnetoresistive sensor, a tunneling magnetoresistive sensor, a giant magnetoresistive sensor, or a Hall-effect sensor, and
   wherein the electric field sensor is a microelectromechanical sensor, a fiber-optic electric field sensor, or an electric field meter.

18. The anomaly detector for energy systems according to claim 6, wherein each magnetic field sensor is an anisotropic magnetoresistive sensor, a tunneling magnetoresistive sensor, a giant magnetoresistive sensor, or a Hall-effect sensor, and
   wherein each electric field sensor is a microelectromechanical sensor, a fiber-optic electric field sensor, or an electric field meter.

* * * * *